(12) United States Patent
Duys et al.

(10) Patent No.: US 11,314,163 B2
(45) Date of Patent: Apr. 26, 2022

(54) PELLICLE FRAME AND PELLICLE ASSEMBLY

(71) Applicant: ASML NETHERLANDS B.V., Veldhoven (NL)

(72) Inventors: Anton Wilhelmus Duys, Eindhoven (NL); Maxim Aleksandrovich Nasalevich, Eindhoven (NL); Arnoud Willem Notenboom, Rosmalen (NL); Mária Péter, Eindhoven (NL); Pieter-Jan Van Zwol, Eindhoven (NL); David Ferdinand Vles, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 111 days.

(21) Appl. No.: 16/754,865

(22) PCT Filed: Aug. 28, 2018

(86) PCT No.: PCT/EP2018/073095
§ 371 (c)(1),
(2) Date: Apr. 9, 2020

(87) PCT Pub. No.: WO2019/081095
PCT Pub. Date: May 2, 2019

(65) Prior Publication Data
US 2020/0319546 A1    Oct. 8, 2020

(30) Foreign Application Priority Data
Oct. 27, 2017 (EP) .................................... 17198755

(51) Int. Cl.
*G03F 1/64* (2012.01)

(52) U.S. Cl.
CPC ...................................... *G03F 1/64* (2013.01)

(58) Field of Classification Search
CPC ..................................... G03F 1/62; G03F 1/64
USPC ............................................................ 430/5
See application file for complete search history.

(56) References Cited

U.S. PATENT DOCUMENTS

| 2003/0020894 | A1 | 1/2003 | Wang |
| 2010/0330466 | A1 | 12/2010 | Shirasaki et al. |
| 2012/0140199 | A1 | 6/2012 | Hotzel |
| 2017/0184956 | A1 | 6/2017 | Kohmura et al. |

FOREIGN PATENT DOCUMENTS

| JP | H05107747 | 4/1993 |
| JP | 2013222143 | 10/2013 |
| JP | 201498913 | 5/2014 |
| WO | 2016079051 | 5/2016 |

OTHER PUBLICATIONS

International Search Report and Written Opinion issue in corresponding PCT Patent Application No. PCT/EP2018/073095, dated Dec. 4, 2018.

*Primary Examiner* — Christopher G Young
(74) *Attorney, Agent, or Firm* — Pillsbury Winthrop Shaw Pittman LLP

(57) ABSTRACT

A pellicle frame for supporting a pellicle, the frame having a first surface and a second surface opposite the first surface, and a structure provided between the first and the second surfaces, wherein the first and second surfaces and the structure at least partially define at least one volume therebetween that is devoid of the material that forms the frame.

20 Claims, 11 Drawing Sheets

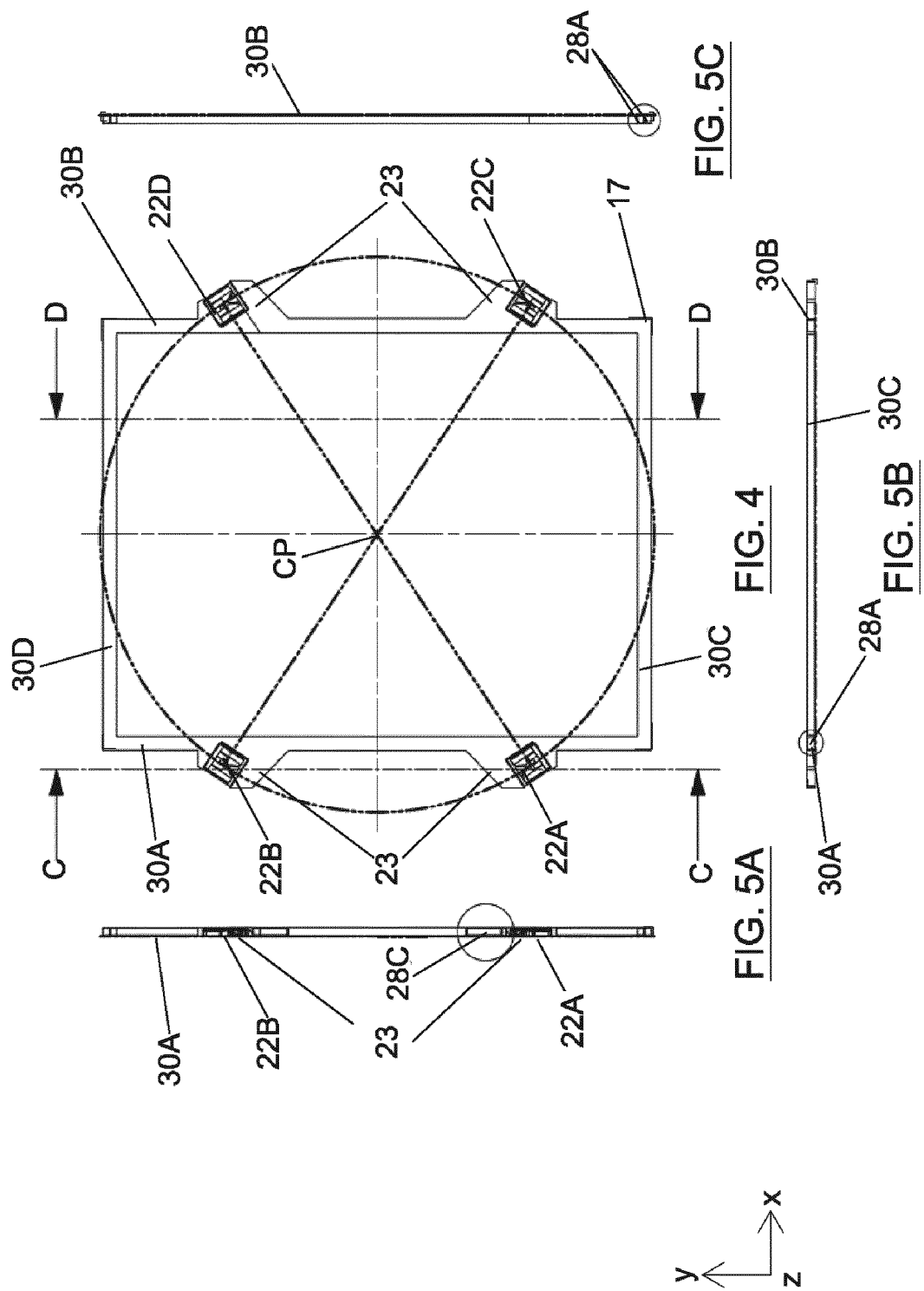

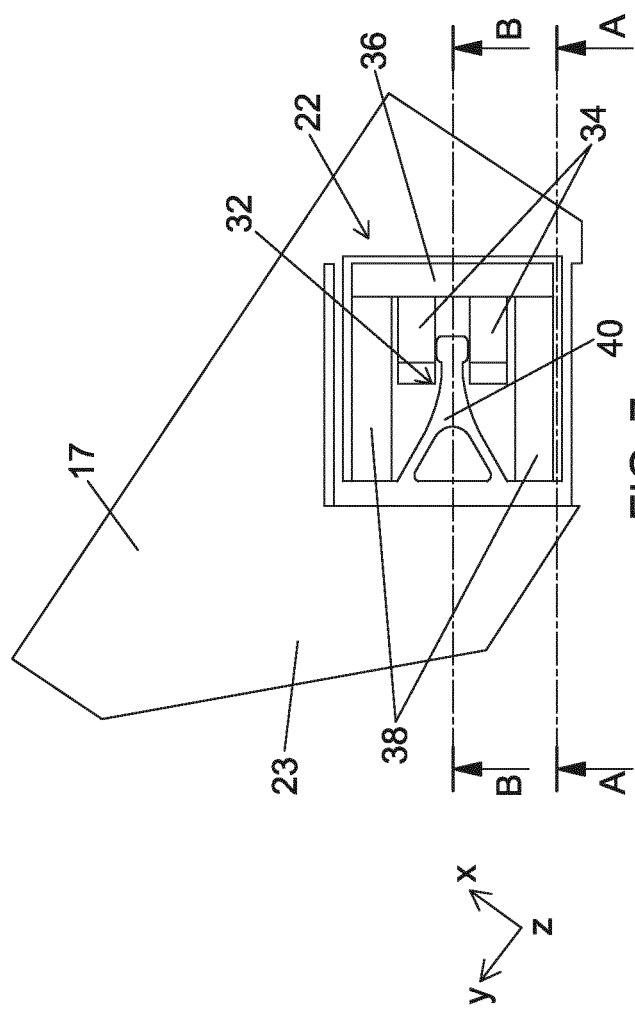
FIG. 7
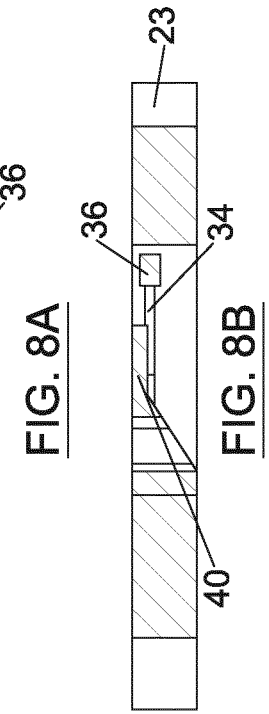
FIG. 8A
FIG. 8B

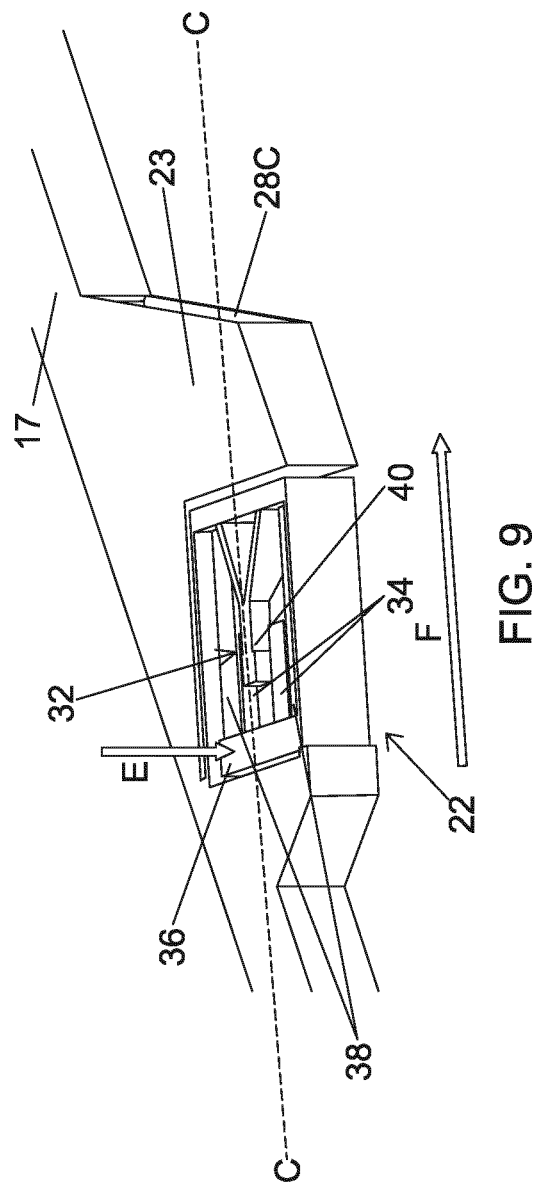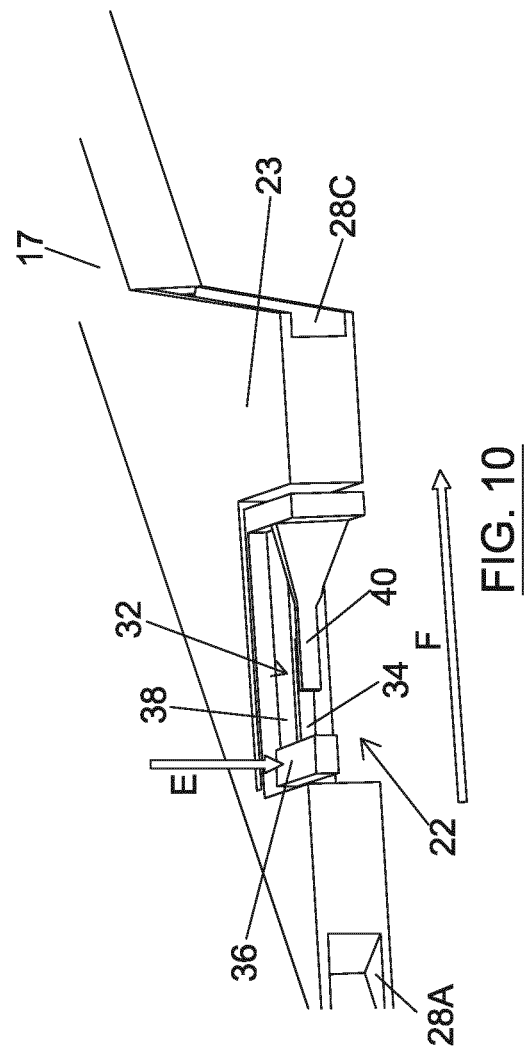

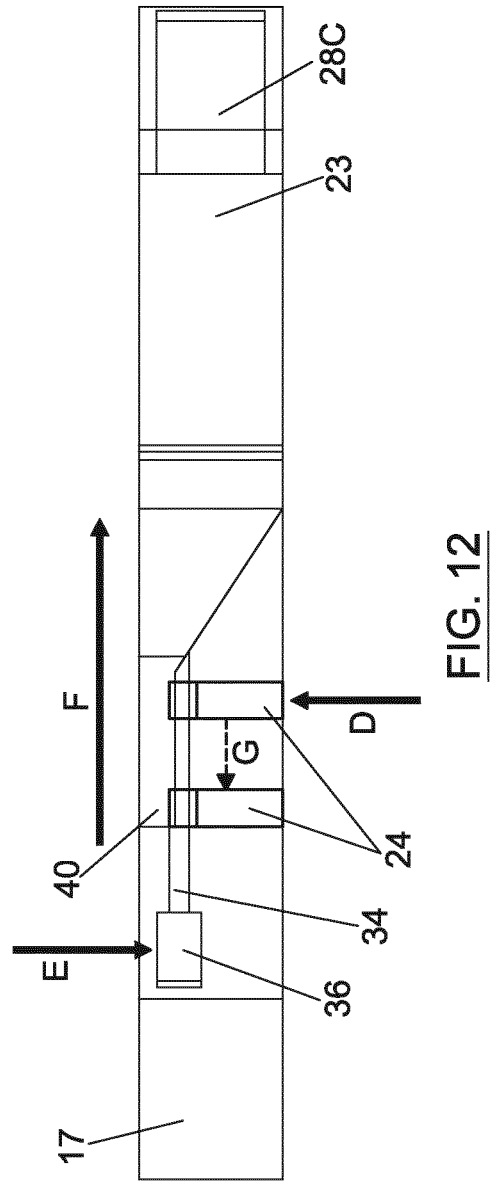

PELLICLE FRAME AND PELLICLE ASSEMBLY

CROSS-REFERENCE TO RELATED APPLICATIONS

This application is the national phase entry of PCT patent application no. PCT/EP2018/073095, which was filed on Aug. 28, 2018, which claims the benefit of priority of European patent application no. 17198755.5 which was filed on Oct. 27, 2017 and which is incorporated herein in its entirety by reference.

FIELD

The present invention relates to a pellicle frame and a pellicle assembly. A pellicle assembly may comprise a pellicle and a pellicle frame for supporting the pellicle. A pellicle may be suitable for use with a patterning device for a lithographic apparatus. The present invention has particular, but not exclusive, use in connection with EUV lithographic apparatus and EUV lithographic tools.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus that uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

The use of pellicles in lithography is well-known and well-established. A typical pellicle in a DUV lithographic apparatus is a membrane which is located away from the patterning device and is out of the focal plane of a lithographic apparatus in use. Because the pellicle is out of the focal plane of the lithographic apparatus, contamination particles which land on the pellicle are out of focus in the lithographic apparatus. Consequently, images of the contamination particles are not projected onto the substrate. If the pellicle were not present, then a contamination particle which landed on the patterning device would be projected onto the substrate and would introduce a defect into the projected pattern.

It may be desirable to use a pellicle in an EUV lithographic apparatus. EUV lithography differs from DUV lithography in that it is typically performed in a vacuum and the patterning device is typically reflective rather than being transmissive.

It is desirable to provide a pellicle frame and/or a pellicle assembly which overcomes or mitigates one or more problems associated with the prior art. Embodiments of the invention which are described herein may have use in an EUV lithographic apparatus. Embodiments of the invention may also have use in a DUV lithographic apparatus and/or another form of lithographic tools.

SUMMARY

According to a first aspect of the invention there is provided a pellicle frame for supporting a pellicle, the frame comprising a first surface and a second surface opposite the first surface, and structure provided between the first and the second surfaces; wherein the first and second surfaces and the structure at least partially define at least one volume therebetween that is devoid of the material that forms the frame.

This may have an advantage that there may be a reduction in the weight of the frame relative to a corresponding frame without the volumes that are devoid of the material that forms the frame and/or the eigenfrequencies of the frame may be raised. This may allow different materials to be used to form the frame. The use of different materials may allow the membrane coefficient of thermal expansion (CTE) to be more closely matched, which may reduce the thermal stress during fabrication of the pellicle.

At least one part of the frame may have a different cross sectional profile to at least one other part of the frame. The distribution of the volumes may differ around the frame or at least between the at least one part of the frame and at least one other part. This may have the advantage that the volumes can be located in a portion of the frame that does not substantially contribute to the stiffness of the frame, e.g. the bending stiffness of the frame, and/or the torsional stiffness of the frame.

The form of the structure that is provided between the first and second surfaces and/or an amount of volume may differ between the at least one part of the frame and the at least one other part.

The volume may define or comprise at least one void, space, hollow, pocket or chamber.

The volume may extend around at least a portion of the circumference of the frame.

The volume may be open.

The volume may be comprised in a matrix of volumes between the first and second surfaces.

The structure may comprise at least a first wall that connects the first and second surfaces.

The frame may comprise a second wall, opposite the first wall, connecting the first and second surfaces, and wherein the volume extends through or between the first and second walls.

The first and second surfaces and the first and second walls may form a hollow tube along at least a part of the length of a side of the frame.

The first and second surfaces and the first wall may form an I-shaped cross section along at least a part of the length of a side of the frame.

The side of the frame may be a free side that is not directly attached or attachable to a patterning device.

The side of the frame may be a supporting side that is configured to be attachable to a patterning device.

At least one of the first surface and the second surface may be continuous.

At least one of the first surface and the second surface may have at least one recess therein.

The frame may comprise at least one engagement mechanism for attaching the frame to a patterning device. This is advantageous because it avoids potentially damaging thermal stresses arising in the frame.

The side of the frame may be a supporting side and the hollow tube may extend from a free side of the frame to the engagement mechanism.

The frame may comprise a plurality of engagement mechanisms and each engagement mechanism may be orientated away from being perpendicular to the side of the frame it is located on. This may have the advantage of allowing for thermal expansion of the frame with respect to the patterning device and may help prevent stress from building up in the patterning device.

Each engagement mechanism may substantially face towards the central point of the frame.

The engagement mechanism may be configured such that an attachment member is removably fixable in a substantially central location in the engagement mechanism. This may have the advantage of reducing torsion.

The engagement mechanism may comprise a pair of first leaf springs and a pair of second leaf springs respectively connected to the first leaf springs, and each leaf spring may extend in generally the same direction.

An intermediate body may be located between the first leaf springs and the second leaf springs.

The length of the first leaf springs and the second leaf springs may have a ratio of between 1.5:1 and 2.5:1.

The first leaf springs may comprise resiliently flexible engagement arms and a beam may be located between the two engagement arms, wherein the beam may extend over halfway across the engagement mechanism. This may have the advantage of providing space for the attachment member.

The pellicle frame may be made from at least one of aluminium and/or aluminium nitride.

According to a second aspect of the invention there is provided a method of manufacturing a pellicle frame for supporting a pellicle, the method comprising forming a pellicle frame from a frame material, the frame comprising a first surface and a second surface opposite the first surface and a structure between the first and the second surfaces, and forming at least one volume that is devoid of frame material between the first and second surfaces.

The at least one volume may be formed by removing at least one volume of frame material between the first and second surfaces.

The method may further comprise forming the volume in a portion of the frame that does not substantially contribute to the stiffness of the frame, the bending stiffness of the frame, and/or the torsional stiffness of the frame.

The frame material may be formed from at least one of aluminium and aluminium nitride.

According to a third aspect of the invention, there is provided a pellicle assembly comprising a pellicle frame as described above and a pellicle.

The pellicle assembly may further comprise a pellicle border. This may have the advantage of reducing stress in the pellicle.

The pellicle border and the pellicle frame may be the same material.

The pellicle border may be made from at least one of aluminium and/or aluminium nitride.

The pellicle frame may be made from at least one of aluminium and/or aluminium nitride.

The pellicle frame may comprise an engagement mechanism.

A block for holding the engagement mechanism may be formed from the same material as the pellicle frame.

According to a fourth aspect of the invention, there is provided a pellicle frame comprising four engagement mechanisms, wherein each engagement mechanism substantially faces towards the central point of the frame. This may have the advantage of allowing for thermal expansion of the frame with respect to the patterning device and helps prevent stress from building up in the patterning device.

According to a fifth aspect of the invention, there is provided a pellicle frame comprising an engagement mechanism, wherein the engagement mechanism is configured such that an attachment member is removably fixable in a substantially centrally in the engagement mechanism. This may have the advantage of reducing torsion.

It will be appreciated that one or more aspects or features described above or referred to in the following description may be combined with one or more other aspects or features.

BRIEF DESCRIPTION OF THE DRAWINGS

Embodiments of the invention will now be described, by way of example only, with reference to the accompanying schematic drawings, in which:

FIG. 4 schematically depicts a top view of a pellicle frame;

FIG. 5A-5F schematically depicts sections and detailed sections taken through FIG. 4;

FIG. 7 schematically depicts a top view of an engagement mechanism;

FIG. 8A schematically depicts a cross section of an engagement mechanism taken through line A-A of FIG. 7;

FIG. 8B schematically depicts a cross section of an engagement mechanism taken through line B-B of FIG. 7.

FIG. 9 schematically depicts a perspective view of the engagement mechanism.

FIG. 10 schematically depicts a perspective view of a cross section of the engagement mechanism taken through line C-C of FIG. 9.

FIG. 11A schematically depicts an end view of an attachment member.

FIG. 11B schematically depicts a side view of the attachment member of FIG. 11A.

FIG. 12 schematically depicts a side view of a cross section of the engagement mechanism taken through line C-C of FIG. 9.

DETAILED DESCRIPTION

Figure 1:
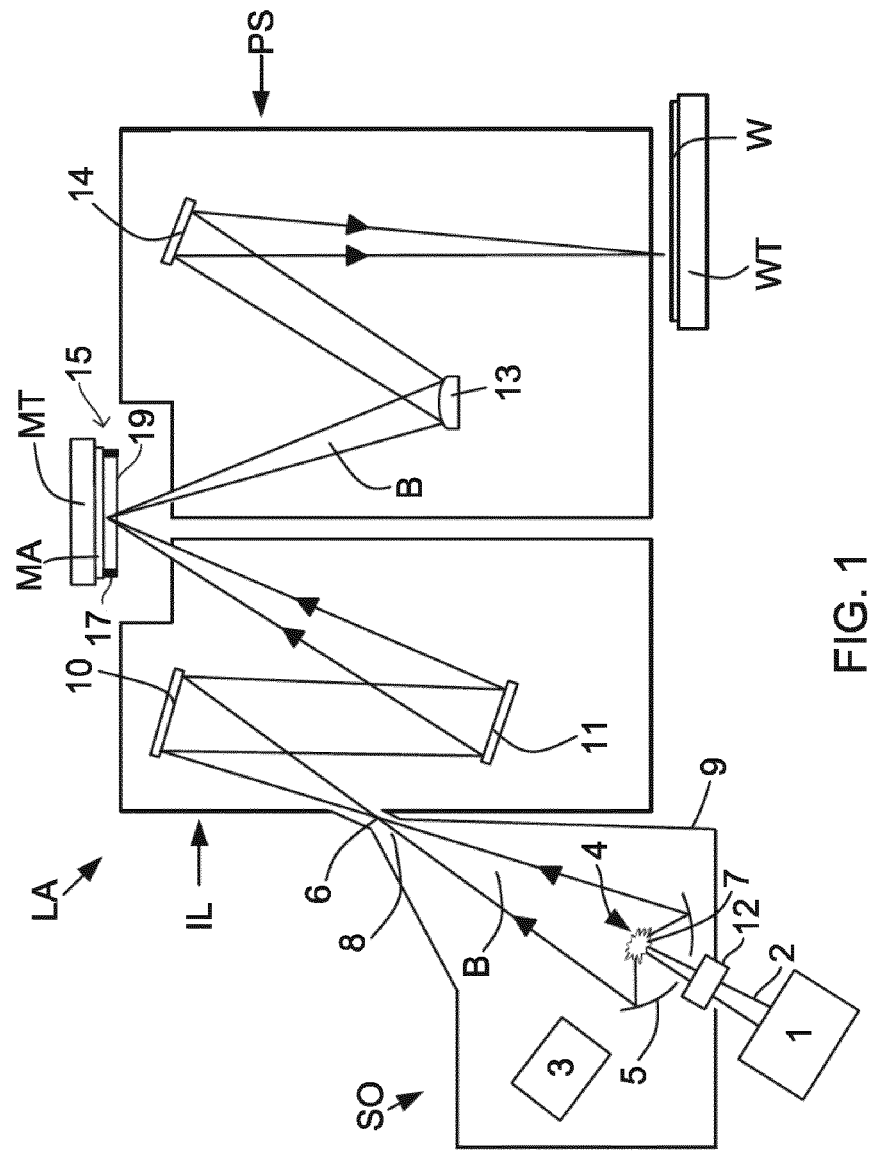
FIG. 1 schematically depicts a lithographic system comprising a lithographic apparatus including a pellicle assembly.

FIG. 1 shows a lithographic system including a pellicle assembly 15 according to one embodiment of the invention. The lithographic system comprises a radiation source SO and a lithographic apparatus LA. The radiation source SO is configured to generate an extreme ultraviolet (EUV) radiation beam B. The lithographic apparatus LA comprises an illumination system IL, a support structure MT configured to support a patterning device MA (e.g. a mask), a projection system PS and a substrate table WT configured to support a substrate W. The illumination system IL is configured to condition the radiation beam B before it is incident upon the patterning device MA. The projection system is configured to project the radiation beam B (now patterned by the mask MA) onto the substrate W. The substrate W may include previously formed patterns. Where this is the case, the lithographic apparatus aligns the patterned radiation beam B with a pattern previously formed on the substrate W.

The radiation source SO, illumination system IL, and projection system PS may all be constructed and arranged such that they can be isolated from the external environment. A gas at a pressure below atmospheric pressure (e.g. hydrogen) may be provided in the radiation source SO. A vacuum may be provided in illumination system IL and/or the projection system PS. A small amount of gas (e.g. hydrogen) at a pressure well below atmospheric pressure may be provided in the illumination system IL and/or the projection system PS.

The radiation source SO shown in FIG. 1 is of a type which may be referred to as a laser produced plasma (LPP) source. A laser 1, which may for example be a $CO_2$ laser, is arranged to deposit energy via a laser beam 2 into a fuel, such as tin (Sn) which is provided from a fuel emitter 3. Although tin is referred to in the following description, any suitable fuel may be used. The fuel may for example be in liquid form, and may for example be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a plasma 7 at the plasma formation region 4. Radiation, including EUV radiation, is emitted from the plasma 7 during de-excitation and recombination of ions of the plasma.

The EUV radiation is collected and focused by a near normal incidence radiation collector 5 (sometimes referred to more generally as a normal incidence radiation collector). The collector 5 may have a multilayer structure which is arranged to reflect EUV radiation (e.g. EUV radiation having a desired wavelength such as 13.5 nm). The collector 5 may have an ellipsoidal configuration, having two ellipse focal points. A first focal point may be at the plasma formation region 4, and a second focal point may be at an intermediate focus 6, as discussed below.

The laser 1 may be remote from the radiation source SO. Where this is the case, the laser beam 2 may be passed from the laser 1 to the radiation source SO with the aid of a beam delivery system (not shown) comprising, for example, suitable directing mirrors and/or a beam expander, and/or other optics. The laser 1 and the radiation source SO may together be considered to be a radiation system.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The radiation source SO is arranged such that the intermediate focus 6 is located at or near to an opening 8 in an enclosing structure 9 of the radiation source.

The radiation beam B passes from the radiation source SO into the illumination system IL, which is configured to condition the radiation beam. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular intensity distribution. The radiation beam B passes from the illumination system IL and is incident upon the patterning device MA held by the support structure MT.

The patterning device MA is protected by a pellicle 19, which is held in place by a pellicle frame 17 (referred to as frame in rest of description). The pellicle 19 and the frame 17 together form the pellicle assembly 15. The patterning device MA (which may for example be a mask) reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B enters the projection system PS. The projection system comprises a plurality of mirrors which are configured to project the radiation beam B onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors in FIG. 1, the projection system may include any number of mirrors (e.g. six mirrors).

The radiation sources SO shown in FIG. 1 may include components which are not illustrated. For example, a spectral filter may be provided in the radiation source. The spectral filter may be substantially transmissive for EUV radiation but substantially blocking for other wavelengths of radiation such as infrared radiation.

As was described briefly above, the pellicle assembly 15 includes the pellicle 19 that is provided adjacent to the patterning device MA. The pellicle 19 is provided in the path of the radiation beam B such that radiation beam B passes through the pellicle 19 both as it approaches the patterning device MA from the illumination system IL and as it is reflected by the patterning device MA towards the projection system PS. The pellicle 19 comprises a thin film that is substantially transparent to EUV radiation (although it will absorb a small amount of EUV radiation). By EUV transparent pellicle or a film substantially transparent for EUV radiation herein is meant that the pellicle 19 is transmissive for at least 65% of the EUV radiation, preferably at least 80% and more preferably at least 90% of the EUV radiation. The pellicle 19 acts to protect the patterning device MA from particle contamination. The pellicle 19 may be herein referred to as an EUV transparent pellicle. The pellicle 19 may be made from Molybdenum Silicide (MoSi). MoSi is stronger than silicon at high temperatures because it cools more quickly than silicon. In other examples, the pellicle may be made from other materials, such as silicon.

Whilst efforts may be made to maintain a clean environment inside the lithographic apparatus LA, particles may still be present inside the lithographic apparatus LA. In the absence of the pellicle 19, particles may be deposited onto the patterning device MA. Particles on the patterning device MA may disadvantageously affect the pattern that is imparted to the radiation beam B and therefore the pattern that is transferred to the substrate W. The pellicle 19 provides a barrier between the patterning device MA and the environment in the lithographic apparatus LA in order to prevent particles from being deposited on the patterning device MA.

In use, the pellicle 19 is positioned at a distance from the patterning device MA that is sufficient that any particles that are incident upon the surface of the pellicle 19 are not in the focal plane of the radiation beam B. This separation between the pellicle 19 and the patterning device MA, acts to reduce the extent to which any particles on the surface of the pellicle 19 impart a pattern to the radiation beam B. It will be appreciated that where a particle is present in the beam of radiation B, but at a position that is not in a focal plane of the beam of radiation B (i.e., not at the surface of the patterning device MA), then any image of the particle will not be in focus at the surface of the substrate W. In some embodiments, the separation between the pellicle 19 and the patterning device MA may, for example, be between 2 mm and 3 mm (e.g. around 2.5 mm). In some embodiments, as described in more detail below, a separation between the pellicle 19 and the patterning device may be adjustable.

Figure 2A:
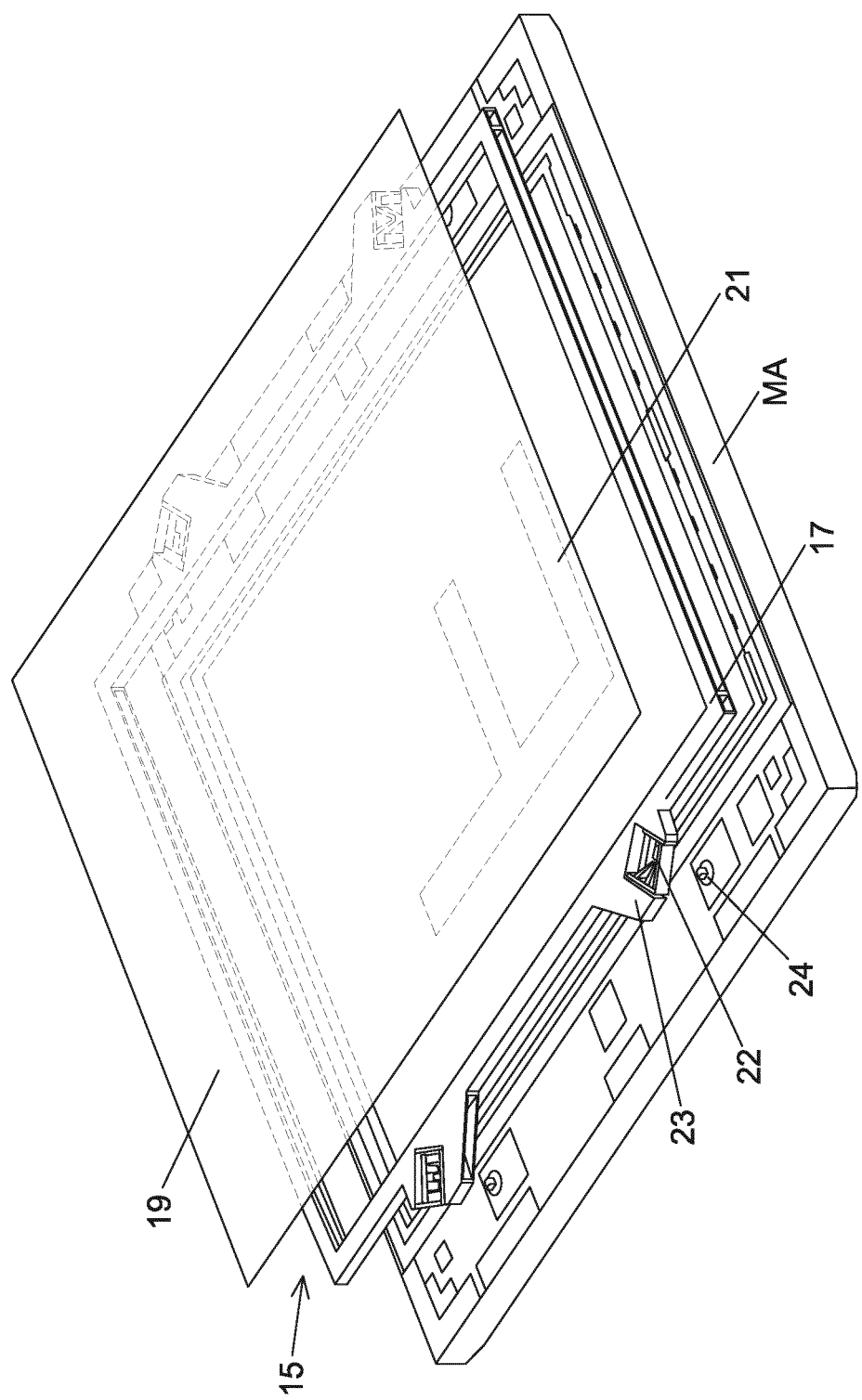
FIG. 2A depicts a pellicle assembly and a patterning device.

FIG. 2A is a perspective view of the pellicle assembly 15 and the patterning device MA. The pellicle assembly 15 may comprise the frame 17 and a pellicle 19 without a pellicle border 20 (see FIG. 2B). The pellicle 19 may be formed directly on the frame 17. The patterning device MA has a patterned surface 21.

Figure 2B:
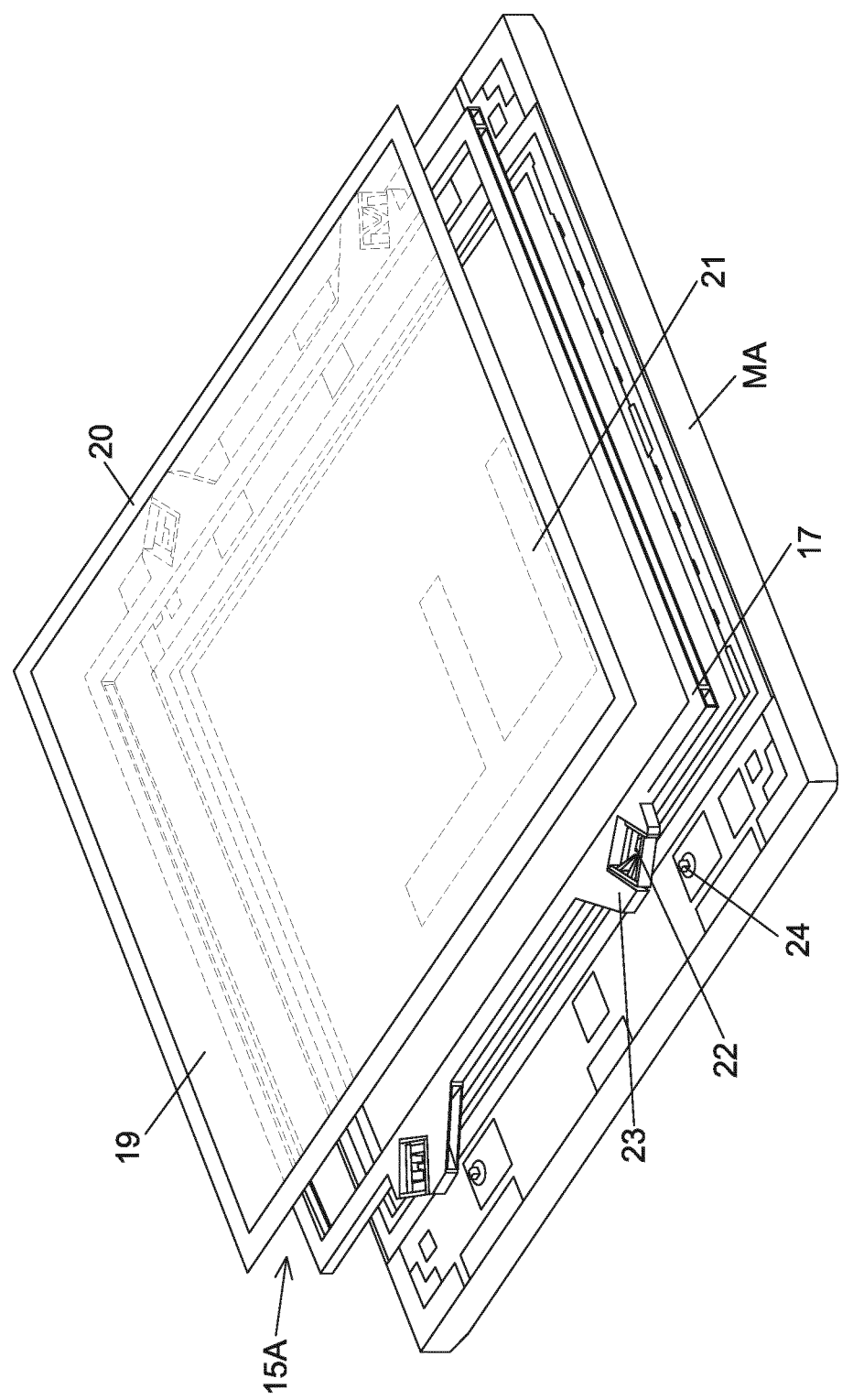
FIG. 2B depicts a pellicle assembly and a patterning device.

In other examples, the pellicle assembly may also comprise the border 20. FIG. 2B is a perspective view of a pellicle assembly 15A and the patterning device MA. The pellicle assembly 15A may comprise the pellicle 19, the frame 17 and the pellicle border 20. The border 20 can optionally be integral with, comprised in or physically separate from the pellicle 19. The border 20 may be significantly thicker than the main portion of the pellicle 19 and may be located around an outer perimeter of the pellicle 19. It is this border 20 which is attached to the frame 17. The frame 17 supports the pellicle 19 around a perimeter portion of the pellicle 19 via the border 20. The border 20 may be glued to the frame 17 or may be attached in another manner. In the examples described, the frame 17 can be used with either the pellicle 19 without the border 20, or the pellicle 19 with the border 20.

Figure 3:
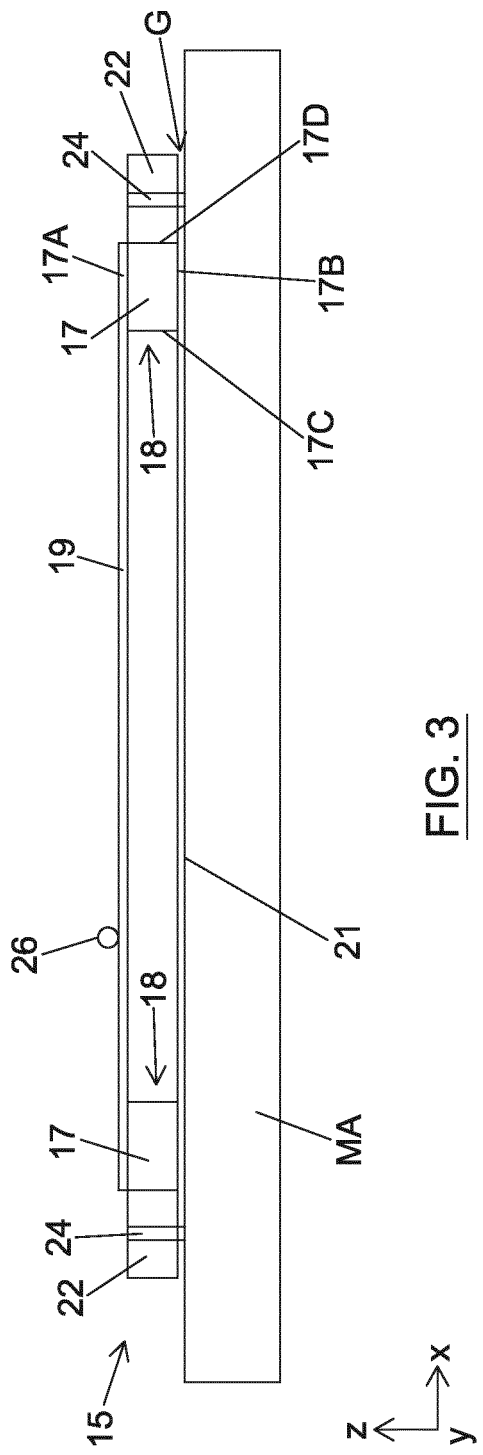
FIG. 3 schematically depicts a cross section of a pellicle assembly and a patterning device.

FIG. 3 is a schematic illustration of the pellicle assembly 15 and the patterning device MA in cross-section and in more detail. A contamination particle 26 is schematically shown. The contamination particle 26 is incident upon the pellicle 19 and is held by the pellicle 19. The pellicle 19 holds the contamination particle 26 sufficiently far from the patterned surface 21 of the mask MA that it is not imaged onto substrates by the lithographic apparatus LA. A pellicle assembly according to an embodiment of the invention may allow a mask pattern (on the patterning device) to be provided which is protected from contamination by the pellicle such that the pattern produced using the mask remains substantially defect free during use. In other examples, the pellicle assembly 15A (i.e. with the border 20) may be used in a similar way.

The pellicle assembly 15A may be constructed by depositing the pellicle 19 directly on top of a substrate which is to provide the border 20. After depositing of the film of the pellicle 19, the substrate may be selectively back-etched to remove a central portion of the substrate and leave only an outer perimeter to form the border 20 to support the pellicle 19.

In other examples, an etch stop (for example $SiO_2$) may be deposited first, then the pellicle core material, and then another etch stop (for example $SiO_2$). The silicon wafer material may be etched away until the etch stop. The etch stop may be then etched away with a different etchant that neither attacks the silicon nor the Molybdenum Silicide MoSi. This leaves a freestanding membrane (pellicle). The pellicle 19 may have a thickness which is, for example, of the order of 15 to 50 nm. In other examples, the pellicle assembly 15 may be constructed by depositing the pellicle 19 directly on top of a substrate which is to provide the frame 17.

The pellicle 19 requires a level of "pre-stress" (i.e. a level of stress which is present within the pellicle 19 when not in use). The pre-stress within the pellicle 19 allows the pellicle 19 to withstand pressure differences brought about by changes in temperature and gas pressure during scanning operations. However, where the pre-stress is too large, this will reduce the overall lifetime of the pellicle assembly 15. As such, it is desired to give the pellicle 19 a minimum pre-stress (in the depicted x-z plane) in order to limit the deflection (in the z direction) at a given pressure on the pellicle 19. When deflection of the pellicle 19 is too large in the z direction, the pellicle 19 might break and/or touch other components in the surrounding area of the pellicle 19.

The pre-stress of the pellicle 19 is preferably limited, since the stress of the pellicle 19 is preferably significantly below the ultimate tensile stress or yield strength of the material from which the pellicle 19 is formed. The margin between pre-stress and the ultimate tensile stress should be as large as possible to increase the lifetime and reliability of the pellicle 19.

Pre-stress may be incorporated in the pellicle 19 through one or more mechanisms including stoichiometry, hydrogenation, control of crystal size, doping and selective mismatch of the coefficient of thermal expansion (CTE) during depositing of the pellicle 19 onto the substrate. The pellicle 19 may also comprise multiple layers (e.g., capping layers to protect the pellicle 19 from, for example, hydrogen radicals). Due to CTE mismatches between layers of the pellicle 19 parts of the pellicle assembly 15 and the process of heteroepitaxy by which the different layers of the pellicle 19 may be deposited, the stresses in each layer of a multi-layer pellicle 19 may be different.

The tension in the pellicle 19 in use will be governed to some extent by the pre-stress applied, as detailed above. The attachment of the pellicle 19 to the border 20 may also be controlled so as to achieve a desirable tension in the pellicle 19. For example, the tension in the pellicle 19 may be measured during or after attachment of the pellicle 19 to the border 20 and the tension may be adjusted in response to the measurement in order to achieve a desirable tension in the pellicle 19. The tension in the pellicle 19 may be maintained, for example, by applying an outward force to components of the border 20 so as to stretch the pellicle 19. Tension in the pellicle 19 may for example be maintained by using differences in thermal expansion coefficients between the frame and the pellicle.

Although illustrated embodiments show the frame being attached at the front of the patterning device MA, in other examples the frame may be attached at other parts of the patterning device MA. For example, the frame may be attached to sides of the patterning device MA. This may be achieved for example using sub-mounts which provide releasably engageable attachment between the frame and sides of the patterning device MA. In an alternative arrangement the frame may be attached to the patterning device MA through a combination of some attachment locations on sides of the patterning device MA and some attachment locations on the front of the patterning device MA. Attachment may for example be provided by sub-mounts which releasably engage the frame and the patterning device MA.

The attachment of the frame 17 to the patterning device MA may be controlled so as to achieve a desirable tension in the pellicle 19. For example, the tension in the pellicle 19 may be measured during attachment of the frame 17 to the patterning device MA and the tension may be adjusted in response to the measurement in order to achieve a desired tension in the pellicle 19.

The frame 17 may include an engagement mechanism 22 configured to allow the frame 17 to be removably attachable to the patterning device MA (i.e. to allow the frame 17 to be attachable to and detachable from the patterning device MA). The engagement mechanism 22 may be located in a block 23 (see FIG. 4) of the frame 17. The engagement mechanism 22 is configured to engage with an attachment member 24 provided on the patterning device MA. The attachment member 24 may, for example, be a protrusion or a stud which extends from the patterning device MA. The engagement mechanism 22 may, for example, comprise a locking member 32 (see FIG. 7) which engages with the protrusion and secures the frame 17 to the patterning device MA.

A plurality of engagement mechanisms 22 and associated attachment members 24 may be provided. The engagement mechanisms 22 may be distributed around the frame 17 (e.g. two engagement mechanisms 22A, 22B on one side of the frame and two engagement mechanisms 22C, 22D on an opposite side of the frame). Associated attachment members may be distributed around the perimeter of the patterning device MA. The engagement mechanisms 22 may be located in blocks 23 (see FIG. 4) of the frame 17.

Referring now to FIG. 4, a top view of the frame 17 is shown. The frame 17 is provided with four engagement mechanisms 22A-22D. Each engagement mechanism 22 may be located in a respective block 23 of the frame 17 which project radially outwardly from the rest of the respective side of the perimeter of the frame 17. Each engagement mechanism 22A-D is configured to receive the respective attachment member 24A-D which extends from the patterning device MA (as described below). The frame 17 in this example has four sides. Two engagement mechanisms 22A,B are provided on one side 30A of the frame 17 and two engagement mechanisms 22C,D are provided on an opposite side of the frame 17. These sides will be referred to as supporting sides 30A, 30B. The other two sides that connect the supporting sides 30A, 30B together, and do not have engagement mechanisms 22A-22D, are referred to as free sides 30C, 30D. Other combinations may also be possible, such as an engagement mechanism on each of the four frame sides etc. The engagement mechanisms 22 are provided on sides of the frame 17 which will be oriented along the scanning direction during use in a lithographic apparatus (indicated in FIGS. 3 and 4 as the y-direction in accordance with conventional notation). However, the engagement mechanisms may be provided on sides of the frame 17 which will be oriented perpendicular to the scanning direction during use in a lithographic apparatus (indicated in FIGS. 3 and 4 as the x-direction in accordance with conventional notation).

The attachment members 24A-D (protrusions) that are received by the engagement mechanisms 22A-D may be located on the front surface of the patterning device MA, i.e. the patterned surface 21. Additionally or alternatively, the protrusions may be located on sides of the patterning device. Protrusions may extend perpendicularly from sides of the patterning device. In such an arrangement the protrusions may each have a flattened lateral surface to facilitate secure bonding to a side of the patterning device.

Each engagement mechanism 22A-D may be obliquely oriented to the sides of the frame, e.g. so that they substantially face towards a central point CP of the frame 17 in the x-y plane. In this case, the central point CP is the geometric center of the frame 17. That is, each engagement mechanism 22A-D has been rotated away from being orientated perpendicularly to the sides of the frame 17 so that it approximately faces the centre of the frame 17. Thus, engagement mechanism 22A faces engagement mechanism 22D, and engagement mechanism 22B faces engagement mechanism 22C. Lines drawn from each engagement mechanism in FIG. 4 intersect at the central point CP. This forms two symmetry planes resulting in a thermal centre in the central point CP of the frame 17. This allows for thermal expansion of the frame 17 with respect to the patterning device MA and prevents stress from building up in the patterning device MA. In other examples, the engagement mechanisms 22 may not be rotated all the way to face towards the central point CP of the frame 17. In this case, the benefits of reduced stress build up will not be as great but there will still be an increased capacity for thermal expansion.

Referring to FIG. 3 once more, the frame 17 may have a first surface 17A and a second surface 17B opposite to the first surface 17A. The first and second surfaces 17A, 17B may be continuous. The pellicle 19 or the border 20, as applicable, may come into contact with the first surface 17A of the frame around its full perimeter. In other examples, the first and/or second surfaces 17A, 17B may have at least one recess or recesses (not shown). In FIG. 3, the first surface 17A is the top surface and the second surface 17B is the bottom surface. When the pellicle 19 is in use, the first surface 17A may face downwards and the second surface may face upwards, but the terminology used here is just for aiding understanding and the directions in which the first and second surfaces 17A, 17B face in use may be different or reversed.

The frame 17 may comprise structure 18 that is provided between, and which connects and separates, the first and second surfaces 17A, 17B. The structure 18 at least partially defines volumes 28A-C such as voids, spaces, hollows, pockets, chambers or the like.

In an example, the structure 18 comprises a first wall 17C. The first wall 17C may be located at the inner perimeter of the frame 17 and may extend around at least part of the circumference of the frame 17. In examples, the first wall 17C may be located between the inner and outer perimeter of the frame 17 and may extend around at least part of the circumference of the frame 17. The first wall 17C may be continuous around at least a part of the circumference of the frame 17 or around the entire circumference of the frame 17. The frame 17 may have a second wall 17D which connects the first and second surfaces 17A, 17B. The second wall 17D may be located at the outer perimeter of the frame 17 and may extend around at least part of the circumference of the frame 17. In examples, the second wall 17D may be located between the inner and outer perimeter of the frame 17 and may extend around at least part of the circumference of the frame 17. The second wall 17D may be continuous around at least a part of the circumference of the frame 17 or around all of the circumference of the frame 17. In examples, the first and/or second walls 17C, 17D extend generally perpendicularly or obliquely to the first and second surfaces 17A, 17B.

FIGS. 5A-5F show sections taken through FIG. 4. As shown in FIGS. 5A-5D, the volumes 28A-C are provided in the frame 17 where material has been removed or is missing from the frame 17. That is, the first and second surfaces 17A, 17B at least partially define the plurality of volumes 28 between the first and second surfaces 17A, 17B that are devoid of the material that forms the frame 17. In examples, the frame 17 may have been formed with no material in the volumes 28. The volumes 28 may be open to the environment, e.g. air, process gasses or a vacuum, or closed. In other examples, the volumes 28 may be filled with material different from the material of the frame 17. For example, the volumes 28 may be filled with a material that is less dense than the material from which the majority of the rest of the frame 17 is formed.

There may be numerous volumes 28 located at different locations along the circumference of the frame 17, these volumes 28 may be joined to each other to form larger volumes or may be separated by the first and/or second walls 17C, 17D. That is, there may be a lattice of volumes 28 formed between the first and second surfaces 17A, 17B.

In addition, at least one part of the frame may have a different cross sectional profile to at least one other part of the frame. In particular, the form of the structure 18 that is provided between the first and second surfaces 17A, 17B (e.g. the number of walls 17C, 17D, the relative arrangement of the walls 17C, 17D, etc.) and the relative amount of volume 28 to structure 18 optionally differs between the at least one part of the frame and the at least one other part, e.g. in order to provide the desired mechanical and thermal properties at those locations. For example, at least one part of the frame 17 may have an I-shaped cross section and least one other part of the frame 17 may have a box or hollow tube section.

FIG. 5B shows a side view of the free side 30C which illustrates that the supporting sides 30A, 30B are at least partially hollowed out to form an open tube structure (i.e. a hollow tube) extending in the y direction. The open space within the hollow tube is the volume 28A. This is shown in more detail in FIG. 5E. The hollow tube provides torsional stiffness. The first and second surfaces 17A, 17B and the first and second walls 17C, 17D form a hollow tube along at least a part of the length of the supporting side 30A of the frame 17. The volume 28A can be considered to extend through or between the first and second walls 17C, 17D. Preferably, the hollow tube extends in the supporting side 30A from the free side 30C to the engagement mechanism 22A. In other examples, the hollow tube may extend in the supporting side 30A from the free side 30C to the block 23 holding the engagement mechanism 22A. The hollow tube may extend along the full length of one or both of the supporting sides 30A, 30B. The hollow tube may only extend along a part of the length of one or both of the supporting sides 30A, 30B. In other examples, the hollow tube may extend along at least part of one or both of the free sides 30C, 30D. In other examples, the cross section of one or both of the supporting sides 30A, 30B may be another shape or hollow structure other than a hollow tube, as long as the required torsional stiffness is provided.

FIG. 5C shows a section view taken through line D-D of FIG. 4 which illustrates the free sides 30C, 30D having an I-shaped cross section extending in the x direction. This is shown in more detail in FIG. 5F. The I-shaped cross section provides bending stiffness. The first and second surfaces 17A, 17B and the first wall 17C form an I-shaped cross section along at least a part of the length of the free side 30C. Due to the I-shaped cross section, there are two volumes 28B running either side of the first wall 17C along at least a part of the length of the side 30C in the x-direction. Preferably, the I-shaped cross section extends in the free side 30C all the way from the supporting side 30A to the supporting side 30B. The I-shaped cross section may extend along the full length of one or both of the free sides 30C, 30D. In other examples, the I-shaped cross section may only extend along a part of the length of one or both of the free sides 30C, 30D. In other examples, the I-shaped cross section may extend along at least part of one or both of the supporting sides 30A, 30B. In other examples, the cross section of one or both of the free sides 30C, 30D may be another shape other than an I-shape, as long as the required bending stiffness is provided.

Figure 5D:
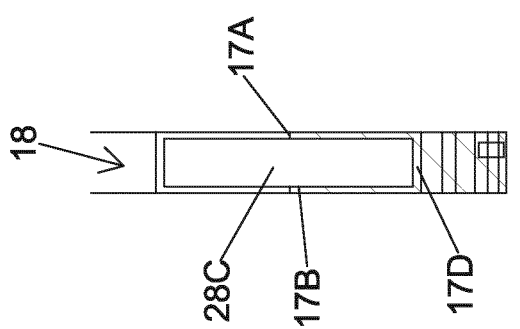
Figure 5E:
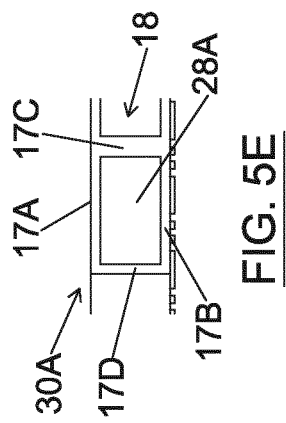
Figure 5F:
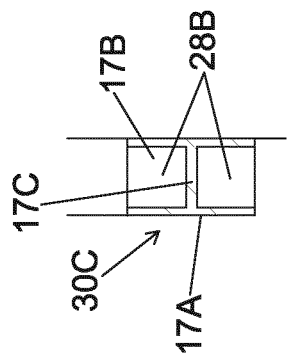

FIG. 5A shows a section view taken through line C-C which illustrates the at least one of the blocks 23 on the supporting side 30A having the volume 28C removed. This is shown in more detail in FIG. 5D. The first and second surfaces 17A, 17B that define the volume 28C are only required as a reference surface. That is, the volume 28C is not required to have material for strength or stiffness. Taking the second wall 17D to extend around the periphery of the block 23, the volume 28C can be considered to extend to the second wall 17D in the x direction. In other examples, the volume 28C may extend through the second wall 17D in the x direction all the way to the first wall 17C at the inner perimeter of the frame 17. The volume 28C may extend through the second wall 17D and through the inner wall 17C such that the volume 28C extends through all, or some, of the supporting side 30A in the x direction. The volume 28C in the block 23 may be any suitable size and may be located in another part of the frame 17. That is, the volume 28C may extend through or between the first and/or second walls 17C, 17D at any location around the circumference of the frame 17.

FIG. 4 shows that the external corners of the block 23 have been removed. That is, material may be removed from the corners of the blocks 23 which would otherwise be there in a standard frame. This is because, due to the rotation of the engagement mechanisms 22 as described above, the support of the block 23 is no longer needed in this area.

Figure 6A:
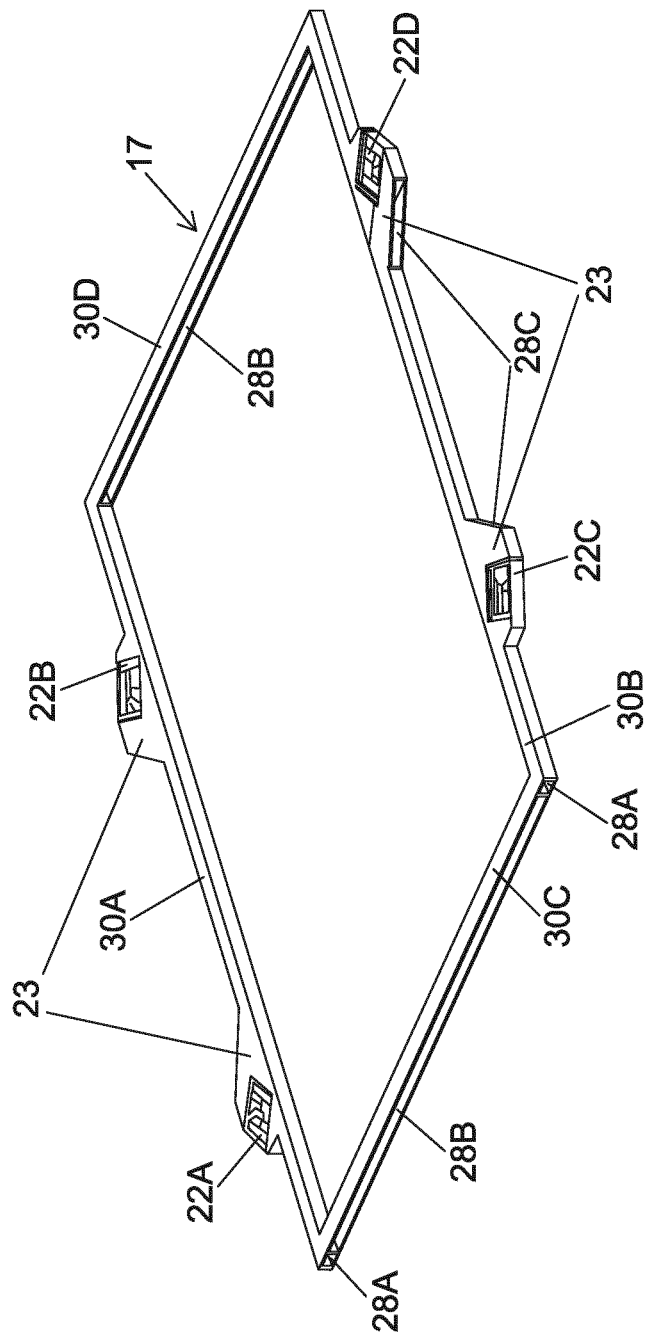
FIG. 6A schematically depicts a perspective view of the frame.

FIG. 6A shows a perspective view of the frame 17 with the four engagement mechanisms 22A-22D located in the blocks 23. The volumes 28A-C are shown in the supporting sides 30A, 30B and the free sides 30C, 30D.

Figure 6B:
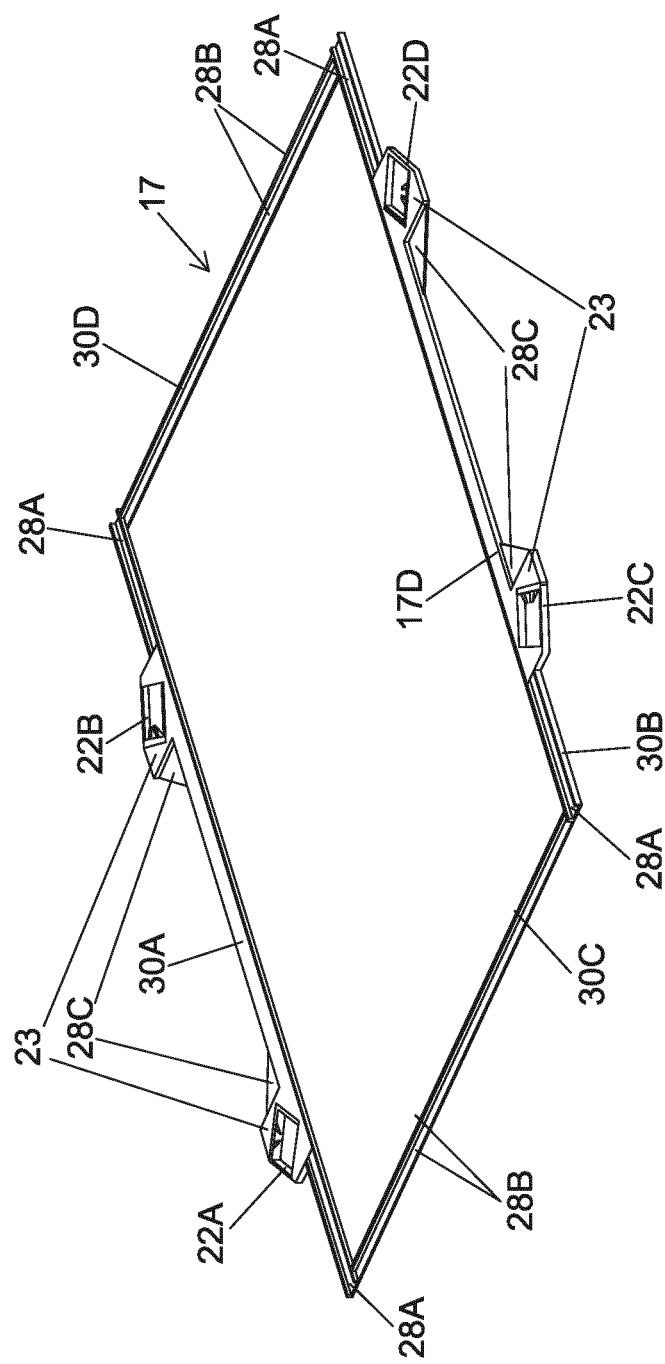
FIG. 6B schematically depicts a perspective view of a cross section of the frame.

FIG. 6B shows a perspective view of a planar cross section of the frame 17. The volumes 28A-C are shown in more detail. Volume 28A is shown as a hollow tube extending in the supporting side 30A from the free side 30C to the block 23 holding the engagement mechanism 22A. Another volume 28A is shown as a hollow tube extending in the supporting side 30B from the free side 30C to the block 23 holding the engagement mechanism 22C. A further volume 28A is shown as a hollow tube extending in the supporting side 30A from the free side 30D to the block 23 holding the engagement mechanism 22B. Another volume 28A is shown as a hollow tube extending in the supporting side 30B from the free side 30D to the block 23 holding the engagement mechanism 22D.

Volumes 28B are shown running along either side of the I-shaped cross sections extending in the free sides 30C, 30D all the way from the supporting side 30A to the supporting side 30B. Volumes 28C are shown extending from the outside of the periphery of the blocks 23 to the second wall 17D, i.e. the volumes 28C take the form of a triangular shaped cavity.

As described in relation to FIGS. 4 and 5A-F, material of the frame 17 has been removed from the frame 17 in the volumes 28 or material was not included in the volumes 28 when the frame 17 was fabricated. The removal of the material of the frame 17 in the volumes 28 may be carried out by any method as known in the field, such as milling, etching. In other examples, the frame could be fabricated without placing any of the material in the volumes 28A-28C, i.e. the volumes already devoid of material, such as by 3D printing. The volumes 28 being devoid of material of the frame 17 means that the weight of the frame 17 has been reduced when compared to a frame 17 which has material in these volumes 28. Furthermore, the eigenfrequencies of the frame 17 have been raised due to the volumes 28 being devoid of the material of the frame 17.

Pellicles have previously been directly fabricated onto a crystalline silicon (c-Si) wafer. In a similar way to as mentioned above, this is done by depositing a thin layer directly on top of a SiOx layer (e.g. of approximately 300 nm) which is then deposited on a silicon wafer with the membrane (pellicle) made freestanding by selectively and anisotropically back etching the c-Si. Thus, a frame of c-Si remains over which there is spanned across, a free-standing membrane (e.g. of 11 cm×14 cm with a thickness in the order of 15-50 nm).

The substrate on which the membranes are grown influences the stresses that end up in the pellicle. It is important to minimise thermal stresses in the fabrication process. This is important as minimising the stress leads to increased usability, robustness and lifetime of the pellicle. The more stress, the more likely the pellicle will fail. To minimise the stress in fabrication, the coefficient of thermal expansion (CTE) of the substrate and the CTE of the membrane that is being formed are preferably matched. As mentioned, crystalline silicon has been used to make pellicles. As an example, when the coefficient of thermal expansion (CTE) of a crystaline silicon wafer matches the CTE of the polycrystalline core (2.6 um/m/K vs~4 um/m/K), not a lot of thermal stresses are added in the fabrication process.

Using the border 20 is advantageous because stress in the pellicle 19 can be reduced by bonding a high CTE material border 20 onto the pellicle 19. A CTE of approximately 7 to 8 μm/m/K and above may be considered to be a high CTE in relation to a pellicle. This switches the CTE induced stress between the frame 17 and pellicle 19 with the CTE induced stress between the border 20 and the pellicle 19. Thus, it is advantageous to provide the border 20, the frame 17 and the blocks 23 from the same material. The border 20 may be the same material as the frame 17 material. The block 23 may be the same material as the material of the frame 17.

An increased CTE of the membrane means that stresses will be increased. In many cases, using a crystalline silicon substrate will not be suitable as it will not be able to match the CTE of the membrane.

Silicon has a relatively high specific modulus (i.e. Youngs Modulus/density) and has relatively high thermal conductivity. Thus, silicon is a good constructions material for light and stiff engineering.

Using a material other than silicon for the frame material presents difficulties in obtaining the specification required for the pellicle assembly 15. These specifications may be, e.g. natural frequency of the pellicle frame, max weight of the pellicle assembly, temperature fluctuations within the assembly etc.

Constructing the pellicle frame 17 with the volumes 28 located in the locations described above allows other materials to be used in place of silicon for the frame 17 and, in some examples, the border 20 of the pellicle. That is, having volumes 28 devoid of material of the frame 17 means the pellicle assembly 15 can be constructed within the specifications required (eigenfrequency, weight etc).

The frame 17 and/or the border 20 may be made from crystalline silicon. The frame 17 and/or the border 20 may be made from aluminium. The frame 17 and/or the border 20 may be made from aluminium nitride. Although, this description refers to aluminium and aluminium nitride for the materials to form the pellicle assembly, other materials could be used, for example Beryllium or a compound thereof.

The use of different materials (such as aluminium or aluminium nitride) for the frame 17 and/or border 20 of the pellicle 19 means that the membrane CTE can be matched better. This then reduces the thermal stress during fabrication of the pellicle 19. For example, the pellicle 19 may be formed of MoSi (which is a relatively high CTE material) and the frame 17 may be made using aluminium or aluminium nitride. This provides a more closely matched CTE between the frame 17 and the pellicle 19 which may reduce the thermal stress during fabrication of the pellicle 19.

Aluminium and aluminium nitride have a lower Young's Modulus than silicon, with the Young's Modulus of aluminium being less than aluminium nitride. This means that for the same density, aluminium and aluminium nitride are less stiff than silicon. Since aluminium has a lower Young's Modulus than aluminium nitride, a frame made of aluminium may benefit much more from the volumes being devoid of material whereas the frame made of aluminium nitride may not benefit as much from the volumes being devoid of material. However, the design of a frame made of either aluminium or aluminium nitride may be the same or similar (i.e. having the same volumes devoid of material) with the natural frequency being increased accordingly.

The volumes 28 which are devoid of material are in specific areas so that the stiffness (whether torsional or bending) of the frame 17 is not substantially lowered. This means that, as aluminium has a similar density to silicon, the necessary stiffness for the required weight is achieved for the aluminium or aluminium nitride frame 17. Thus, volumes 28 of the frame 17 which do not relatively contribute to the stiffness have been removed. The volumes 28 being devoid of material does not substantially diminish the stiffness of the frame 17. The stiffness of the frame 17 aligns with the loading on the frame 17.

Stiffness of the frame 17 is required in particular directions at particular locations. For example, in the free sides 30C, 30D of the frame 17 stiffness is required in the plane of the pellicle frame (x-y plane) thus the I-shaped cross section is used in this area. The volumes 28 do not substantially diminish the bending stiffness of the frame 17. For example, in the supporting sides 30A, 30B of the frame 17 torsional stiffness is required thus the hollow tube is used in this area. The volumes 28 do not substantially diminish the torsional stiffness of the frame 17.

Stress that originates from the deposition process can be decoupled from the stress (e.g. pre-stress) that is desired. For example, if a microstructure provides an ideal lifetime but results in too little stress, then the structure can be tuned to provide the desired balance.

Although examples have been shown where the material of the frame 17 has been removed from volumes 28 in particular locations, it will be appreciated that the weight of the frame 17 can be reduced by removing material from volumes in any part of the frame 17. Furthermore, it will be appreciated that although the I-shaped cross section and the hollow tube has been shown as examples, other cross sectional shapes may be used to provide the required stiffness of the frame, whether torsional or bending stiffness.

As an example, using aluminium as a material and using the frame shown in FIGS. 4, 5A-5F, the weight of the frame 17, border 20, blocks 23 and attachment member 24 can be reduced to 10 grams from 14 grams (which would be the weight using a standard frame made from aluminium).

As mentioned, removal of material of the frame 17 in the volumes 28 at specific locations in the frame 17 raises the eigenfrequency of the frame 17. As an example, using aluminium as a material and using the frame shown in FIGS.

4, 5A-5F, the lowest eigenfrequency may be 405 Hz which compares with 355 Hz for a standard frame made of silicon.

FIG. 7 shows a top view of the engagement mechanism 22 secured to the block 23 of the frame 17. In this example, the engagement mechanism 22 has been rotated away from being orientated perpendicularly to the sides of the frame 17 but in other examples the engagement mechanism may be aligned in the x direction. The engagement mechanisms 22A-D allow for movement in the x and y directions (see FIG. 4). The engagement mechanism 22 is configured to allow engagement to the attachment members 24 (not depicted). The attachment member 24 may, for example, be glued to the patterning device MA or may be attached by other bonding means (optical contacting, magnetic or van der Waals forces, etc).

The engagement mechanism 22 and the attachment member 24 suspend the pellicle frame 17 relative to the patterning device MA such that there is a gap G (which may be considered to be a slit) between the pellicle frame and the patterning device (see FIG. 3). The gap G may be maintained by some movement limiting component. The gap G may be sufficiently wide to allow equalization of pressure between the exterior environment and the space between the pellicle and the patterning device. The gap G may also be sufficiently narrow so that it provides a desired restriction of the potential route of contamination particles from the exterior environment to the space between the pellicle and the patterning device. The gap G may for example be at least 100 microns in order to allow equalization of pressure between the exterior environment and the space between the pellicle and the patterning device. The gap G may for example be less than 500 microns, more preferably less than 300 microns. The gap G may for example be between 200 microns and 300 microns.

The engagement mechanism 22 has a locking member 32 which is configured to lock to the attachment member 24. The locking member 32 has two resiliently flexible engagement arms 34 in the form of two first leaf springs which extend generally in the y direction from an intermediate body 36. The engagement arms 34 provide a surface for the attachment member 24 to rest on. The intermediate body 36 extends generally in the x direction. The intermediate body 36 is in turn connected to two additional resiliently flexible engagement arms 38 in the form of two second leaf springs which also extend generally in the y direction but by a further distance than the engagement arms 34. The lengths of the first leaf springs 34 and the second leaf springs 38 have a ratio of between 1.5:1 and 2.5:1, e.g. 2:1. This keeps the attachment member (or stud) with a resting surface as level as possible.

A beam 40 is located between the two engagement arms 34 and extends from the opposite side of the engagement member 22 with respect to the intermediate body 36 in generally the y direction. The beam 40 functions as a stop to fix the attachment member 24 against the engagement arms 34. Space is provided for the attachment member 24 by the beam 40 extending generally in the y direction. Thus, the beam 40 of the engagement mechanism 22 extends by a distance that allows the attachment member 24 to be inserted into the engagement mechanism 22. The beam 40 may extend more than half way across the engagement member 22.

FIG. 8A schematically depicts a cross section of the engagement mechanism 22 taken through line A-A of FIG. 7. FIG. 8B schematically depicts a cross section of the engagement mechanism 22 taken through line B-B of FIG. 7.

FIG. 9 schematically depicts a perspective view of the engagement mechanism 22 secured to the block 23 of the frame 17.

FIG. 10 schematically depicts a perspective view of a cross section of the engagement mechanism 22 taken through line C-C of FIG. 9.

FIG. 11A is an end view of the attachment member 24 (stud) which is used to lock the engagement mechanism 22 to the patterning device MA. FIG. 11B is side view of the attachment member 24 (stud) which is used to lock the engagement mechanism 22 to the patterning device MA. In other examples, the attachment member may be another shape and size.

FIG. 12 schematically depicts a side view of a cross section of the engagement mechanism 22 taken through line C-C of FIG. 9. The attachment member 24 extends from the patterning device MA (not shown) and is fixed to the patterning device MA. To use the locking member 32 to lock the frame 17 to the patterning device MA, the frame 17 is pressed against the attachment member 24 and then the engagement mechanism 22 is pressed down to create the space for the frame 17 to be slotted into place. In particular, the attachment member 24 is moved in the direction of arrow D with respect to the engagement mechanism 22. Then the intermediate body 36 of the engagement mechanism 22 is pushed downwards in the direction of arrow E (z direction in FIG. 7) which in turn pushes down the two engagement arms 34 of the engagement mechanism 22.

With the engagement arms 34 being pressed downwards, space is created in the engagement mechanism 22 for the attachment member 24 to be slotted into position below the stop of the beam 40. To do this, the frame 17, and thus the engagement mechanism 22, is moved in the direction of arrow F which in turn means the attachment member 24 is effectively moved with respect to the engagement mechanism 22 in the direction of dashed arrow G. The attachment member 24 is then in its locking position.

Once the intermediate body 36 and thus the engagement arms 34 are released, i.e. the force pushing them in the direction of arrow E is removed, the attachment member 24 is sandwiched between the stop of the beam 40 and the engagement arms 34. The engagement mechanism 22 is thus locked to the attachment member 24 and, as the engagement mechanism 22 is fixed to the frame 17 and the attachment member 24 is fixed to the patterning device MA, the frame 17 is locked to the patterning device MA. The locking process described above may be carried out for each of the engagement mechanisms 22A-22D.

The configuration of the engagement mechanism 22 has the advantage that the engagement mechanism 22 is loaded in the centre of the engagement mechanism 22 which avoids the introduction of unwanted torsion. Thus, the engagement mechanism 22 is configured such that the attachment member 24 is removably fixable in a substantially central location in the engagement mechanism 22. This is in contrast with a standard engagement mechanism which have supporting arms located towards the sides of the engagement mechanism which introduces unwanted torsion.

With the attachment member 24 fixed to the engagement mechanism 22, and the engagement mechanisms 22 allowing the frame 17 to flex in both the x and y directions, thermal stress during the fabrication of the pellicle 19 can be reduced. The movement/flexibility which is provided by the engagement mechanisms 22A-D and the attachment members 24 allow flexing of the pellicle frame 17 relative to the patterning device MA as needed when temperature changes occur. This is advantageous because it avoids potentially damaging thermal stresses arising in the pellicle frame 17.

In an embodiment, the invention may form part of a mask inspection apparatus. The mask inspection apparatus may use EUV radiation to illuminate a mask and use an imaging sensor to monitor radiation reflected from the mask. Images received by the imaging sensor are used to determine whether or not defects are present in the mask. The mask inspection apparatus may include optics (e.g. mirrors) configured to receive EUV radiation from an EUV radiation source and form it into a radiation beam to be directed at a mask. The mask inspection apparatus may further include optics (e.g. mirrors) configured to collect EUV radiation reflected from the mask and form an image of the mask at the imaging sensor. The mask inspection apparatus may include a processor configured to analyse the image of the mask at the imaging sensor, and to determine from that analysis whether any defects are present on the mask. The processor may further be configured to determine whether a detected mask defect will cause an unacceptable defect in images projected onto a substrate when the mask is used by a lithographic apparatus.

In an embodiment, the invention may form part of a metrology apparatus. The metrology apparatus may be used to measure alignment of a projected pattern formed in resist on a substrate relative to a pattern already present on the substrate. This measurement of relative alignment may be referred to as overlay. The metrology apparatus may for example be located immediately adjacent to a lithographic apparatus and may be used to measure the overlay before the substrate (and the resist) has been processed.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although FIGS. 1 and 2 depict the radiation source SO as a laser produced plasma LPP source, any suitable source may be used to generate EUV radiation. For example, EUV emitting plasma may be produced by using an electrical discharge to convert fuel (e.g. tin) to a plasma state. A radiation source of this type may be referred to as a discharge produced plasma (DPP) source. The electrical discharge may be generated by a power supply which may form part of the radiation source or may be a separate entity that is connected via an electrical connection to the radiation source SO.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Embodiments are provided according to the following clauses:

1. A pellicle frame for supporting a pellicle, the frame comprising:

a first surface and a second surface opposite the first surface; and structure provided between the first and the second surfaces, wherein the first and second surfaces and the structure at least partially define at least one volume therebetween that is devoid of the material that forms the frame.

2. The pellicle frame according to clause 1, wherein at least one part of the frame may have a different cross sectional profile to at least one other part of the frame.

3. The pellicle frame according to clause 2, wherein the form of the structure that is provided between the first and second surfaces and/or an amount of volume differs between the at least one part of the frame and the at least one other part.

4. The pellicle frame according to any of clauses 1-3, wherein the volume defines or comprises at least one void, space, hollow, pocket or chamber.

5. The pellicle frame according to any of clauses 1-4, wherein the volume extends around at least a portion of the circumference of the frame.

6. The pellicle frame according to any of clauses 1-5, wherein the volume is open.

7. The pellicle frame according to any of clauses 1-6, wherein the volume is comprised in a matrix of volumes between the first and second surfaces.

8. The pellicle frame according to any of clauses 1-7, wherein the structure comprises at least a first wall that connects the first and second surfaces.

9. The pellicle frame according to clause 8, wherein the frame comprises a second wall, opposite the first wall, connecting the first and second surfaces, and wherein the volume extends through or between the first and second walls.

10. The pellicle frame according to clause 9, wherein the first and second surfaces and the first and second walls form a hollow tube along at least a part of the length of a side of the frame.

11. The pellicle frame according to any of clauses 1-10, wherein the first and second surfaces and the first wall form an I-shaped cross section along at least a part of the length of a side of the frame.

12. The pellicle frame according to clause 10 or clause 11, wherein the side of the frame is a free side that is not directly attached or attachable to a patterning device.

13. The pellicle frame according to clause 10 or clause 11, wherein the side of the frame is a supporting side that is configured to be attachable to a patterning device.

14. The pellicle frame according to any of clauses 1-13, wherein at least one of the first surface and the second surface are continuous.

15. The pellicle frame according to any of clauses 1-14, wherein at least one of the first surface and the second surface have at least one recess therein.
16. The pellicle frame according to any of clauses 1-15, wherein the frame comprises at least one engagement mechanism for attaching the frame to a patterning device.
17. The pellicle frame according to clause 16 when dependent on clause 10, wherein the side of the frame is a supporting side and the hollow tube extends from a free side of the frame to the engagement mechanism.
18. The pellicle frame according to clause 16 or clause 17, wherein the frame comprises a plurality of engagement mechanisms and each engagement mechanism is orientated away from being perpendicular to the side of the frame it is located on.
19. The pellicle frame according to any of clauses 16 to 18, wherein each engagement mechanism substantially faces towards the central point of the frame.
20. The pellicle frame according to any of clauses 16 to 19, wherein the engagement mechanism is configured such that an attachment member is removably fixable in a substantially central location in the engagement mechanism.
21. The pellicle frame according to any of clauses 16 to 20, wherein the engagement mechanism comprises a pair of first leaf springs and a pair of second leaf springs respectively connected to the first leaf springs, each leaf spring extending in generally the same direction.
22. The pellicle frame according to clause 21, wherein an intermediate body is located between the first leaf springs and the second leaf springs.
23. The pellicle frame according to clause 21 or clause 22, wherein the length of the first leaf springs and the second leaf springs have a ratio of between 1.5:1 and 2.5:1.
24. The pellicle frame according to any of clauses 21 to 23, wherein the first leaf springs comprise resiliently flexible engagement arms and a beam is located between the two engagement arms, wherein the beam extends over halfway across the engagement mechanism.
25. The pellicle frame according to any of clauses 1-24, wherein the pellicle frame is made from at least aluminum or aluminum nitride.
26. A method of manufacturing a pellicle frame for supporting a pellicle, the method comprising:
    forming a pellicle frame from a frame material, the frame comprising a first surface and a second surface opposite the first surface and a structure between the first and the second surfaces, and
    forming at least one volume that is devoid of frame material between the first and second surfaces.
27. The method of clause 26 wherein the at least one volume is formed by removing at least one volume of frame material between the first and second surfaces.
28. The method of clause 26 or clause 27, wherein the method comprises forming the volume in a portion of the frame that does not substantially contribute to the stiffness of the frame, the bending stiffness of the frame, and/or the torsional stiffness of the frame.
29. The method of any of clauses 26 to 29, wherein the frame material is formed from at least aluminum or aluminum nitride.
30. A pellicle assembly comprising a pellicle frame according to any of clauses 1-25 and a pellicle.
31. The pellicle assembly according to clause 30, further comprising a pellicle border.
32. The pellicle assembly according to clause 31, wherein the pellicle border and the pellicle frame are the same material.
33. The pellicle assembly according to clause 31 or clause 32, wherein the pellicle border is made from at least aluminum or aluminum nitride.
34. The pellicle assembly according to any of clauses 30 to 33, wherein the pellicle frame is made from at least aluminum or aluminum nitride.
35. The pellicle assembly according to any of clauses 30 to 34, wherein the pellicle frame comprises an engagement mechanism.
36. The pellicle assembly according to clause 35, wherein a block for holding the engagement mechanism is formed from the same material as the pellicle frame.
37. A pellicle frame comprising four engagement mechanisms, wherein each engagement mechanism substantially faces towards the central point of the frame.
38. A pellicle frame comprising an engagement mechanism, wherein the engagement mechanism is configured such that an attachment member is removably fixable in a substantially centrally in the engagement mechanism.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:
1. A pellicle frame for supporting a pellicle, the frame comprising:
    a first solid surface and a second solid surface opposite the first surface; and
    a structure provided between the first and the second surfaces,
    wherein the first and second surfaces and the structure at least partially define at least one tube along at least a part of a length of a side of the frame, the at least one tube devoid of the material that forms the frame.
2. The pellicle frame according to claim 1, wherein at least one part of the frame has a different cross sectional profile to at least one other part of the frame.
3. The pellicle frame according to claim 2, wherein the form of the structure that is provided between the first and second surfaces and/or an amount of volume differs between the at least one part of the frame and the at least one other part.
4. The pellicle frame according to claim 1, wherein the structure comprises at least a first wall that connects the first and second surfaces.
5. The pellicle frame according to claim 4, wherein the frame comprises a second wall, opposite the first wall, connecting the first and second surfaces, and wherein the at least one tube extends through or between the first and second walls.
6. The pellicle frame according to claim 5, wherein the first and second surfaces and the first and second walls form the at least one tube.
7. The pellicle frame according to claim 1, wherein the frame comprises at least one engagement mechanism configured to attach the frame to a patterning device.
8. The pellicle frame according to claim 7, wherein the side of the frame is a supporting side and the at least one tube extends from a free side of the frame to the engagement mechanism.
9. The pellicle frame according to claim 7, wherein the frame comprises a plurality of engagement mechanisms and each engagement mechanism is orientated away from being perpendicular to the side of the frame it is located on.

10. The pellicle frame according to claim 7, wherein each engagement mechanism substantially faces towards the central point of the frame.

11. The pellicle frame according to claim 7, wherein the engagement mechanism is configured such that an attachment member is removably fixable in a substantially central location in the engagement mechanism.

12. The pellicle frame according to claim 7, wherein the engagement mechanism comprises a pair of first leaf springs and a pair of second leaf springs respectively connected to the first leaf springs, each leaf spring extending in generally the same direction.

13. The pellicle frame according to claim 12, wherein an intermediate body is located between the first leaf springs and the second leaf springs.

14. The pellicle frame according to claim 12, wherein the length of the first leaf springs and the second leaf springs have a ratio of between 1.5:1 and 2.5:1.

15. The pellicle frame according to claim 12, wherein the first leaf springs comprise resiliently flexible engagement arms and a beam is located between at least two engagement arms, wherein the beam extends over halfway across the engagement mechanism.

16. A method of manufacturing a pellicle frame for supporting a pellicle, the method comprising:
 forming a pellicle frame from a frame material, the frame comprising a first solid surface and a second solid surface opposite the first surface and a structure between the first and the second surfaces, and
 forming at least one tube along at least a part of a length of a side of the frame, the at least one tube devoid of frame material between the first and second surfaces and at least partially defined by the first and second surfaces and the structure.

17. A pellicle assembly comprising the pellicle frame according to claim 1 and a pellicle.

18. The pellicle assembly according to claim 17, wherein the pellicle frame comprises an engagement mechanism.

19. A pellicle frame comprising four engagement mechanisms, wherein each engagement mechanism substantially faces towards the central point of the frame.

20. A pellicle frame comprising an engagement mechanism, wherein the engagement mechanism is configured such that an attachment member is removably fixable in a substantially central location in the engagement mechanism.

\* \* \* \* \*